US010734264B2

(12) United States Patent
King et al.

(10) Patent No.: US 10,734,264 B2
(45) Date of Patent: Aug. 4, 2020

(54) WAFER CONTAINER WITH EXTERNAL PASSIVE GETTER MODULE

(71) Applicant: ENTEGRIS, INC., Billerica, MA (US)

(72) Inventors: Jeffrey J. King, Colorado Springs, CO (US); Matthew A. Fuller, Colorado Springs, CO (US); John Burns, Colorado Springs, CO (US); Martin Forbes, Divide, CO (US)

(73) Assignee: ENTEGRIS, INC., Billerica, MA (US)

( * ) Notice: Subject to any disclaimer, the term of this patent is extended or adjusted under 35 U.S.C. 154(b) by 139 days.

(21) Appl. No.: 15/573,311

(22) PCT Filed: May 12, 2016

(86) PCT No.: PCT/US2016/032206
§ 371 (c)(1),
(2) Date: Nov. 10, 2017

(87) PCT Pub. No.: WO2016/183376
PCT Pub. Date: Nov. 17, 2016

(65) Prior Publication Data
US 2018/0138065 A1    May 17, 2018

Related U.S. Application Data

(60) Provisional application No. 62/160,467, filed on May 12, 2015.

(51) Int. Cl.
*H01L 21/673* (2006.01)
*H01L 23/00* (2006.01)

(52) U.S. Cl.
CPC ...... *H01L 21/67393* (2013.01); *H01L 23/564* (2013.01)

(58) Field of Classification Search
CPC . A45C 13/02; G10D 3/00; G10G 5/00; G10G 7/005
(Continued)

(56) References Cited

U.S. PATENT DOCUMENTS 5,346,518 A * 9/1994 Baseman ................. B65G 1/00
206/204
6,209,717 B1 * 4/2001 Flynn ..................... G10G 7/005
206/204
(Continued)

FOREIGN PATENT DOCUMENTS

JP  2002176097 A * 6/2002
KR 20040002969 A   1/2004
KR 20080049814 A   6/2008

*Primary Examiner* — J. Gregory Pickett
*Assistant Examiner* — Tia Cox
(74) *Attorney, Agent, or Firm* — Entegris, Inc.

(57) ABSTRACT

A semiconductor wafer container assembly includes a container defining an exterior and defining an interior having a wafer storage area adapted to support one or more semiconductor wafers. The container also defines an opening in the container between the exterior and the interior. The container has a door and a latching mechanism to sealingly secure the door closed, and the door is openable for access to the wafer storage area. A passive getter module is removably secured with respect to the exterior of the container by substantially rigid connection structure that is a part of or extends from substantially rigid getter module housing. Getter material is disposed within the housing to decrease concentration of contaminants within the wafer storage area of the container via the access opening and the opening in the container.

10 Claims, 14 Drawing Sheets

(58) Field of Classification Search
USPC ............. 206/204–5, 213.1, 710–11, 14, 314; 118/500; 220/87.1
See application file for complete search history.

(56) References Cited

U.S. PATENT DOCUMENTS

| | | | |
|---|---|---|---|
| 7,528,936 B2* | 5/2009 | Gregerson | G03B 27/58 |
| | | | 206/710 |
| 8,776,841 B2* | 7/2014 | Kishkovich | G03F 1/66 |
| | | | 141/63 |
| 8,888,086 B2* | 11/2014 | Rastegar | G03F 1/66 |
| | | | 206/710 |
| 9,054,144 B2* | 6/2015 | Burns | H01L 21/67376 |
| 2004/0074807 A1* | 4/2004 | Chih-Kang | H01L 21/67772 |
| | | | 206/710 |
| 2005/0077204 A1* | 4/2005 | Sumi | F16K 15/026 |
| | | | 206/710 |
| 2011/0114534 A1 | 5/2011 | Watson et al. | |
| 2011/0139675 A1* | 6/2011 | Ku | H01L 21/67369 |
| | | | 206/711 |
| 2015/0041360 A1* | 2/2015 | Watson | H01L 21/67393 |
| | | | 206/711 |
| 2015/0117986 A1* | 4/2015 | Lai | H01L 21/67389 |
| | | | 414/217.1 |

\* cited by examiner

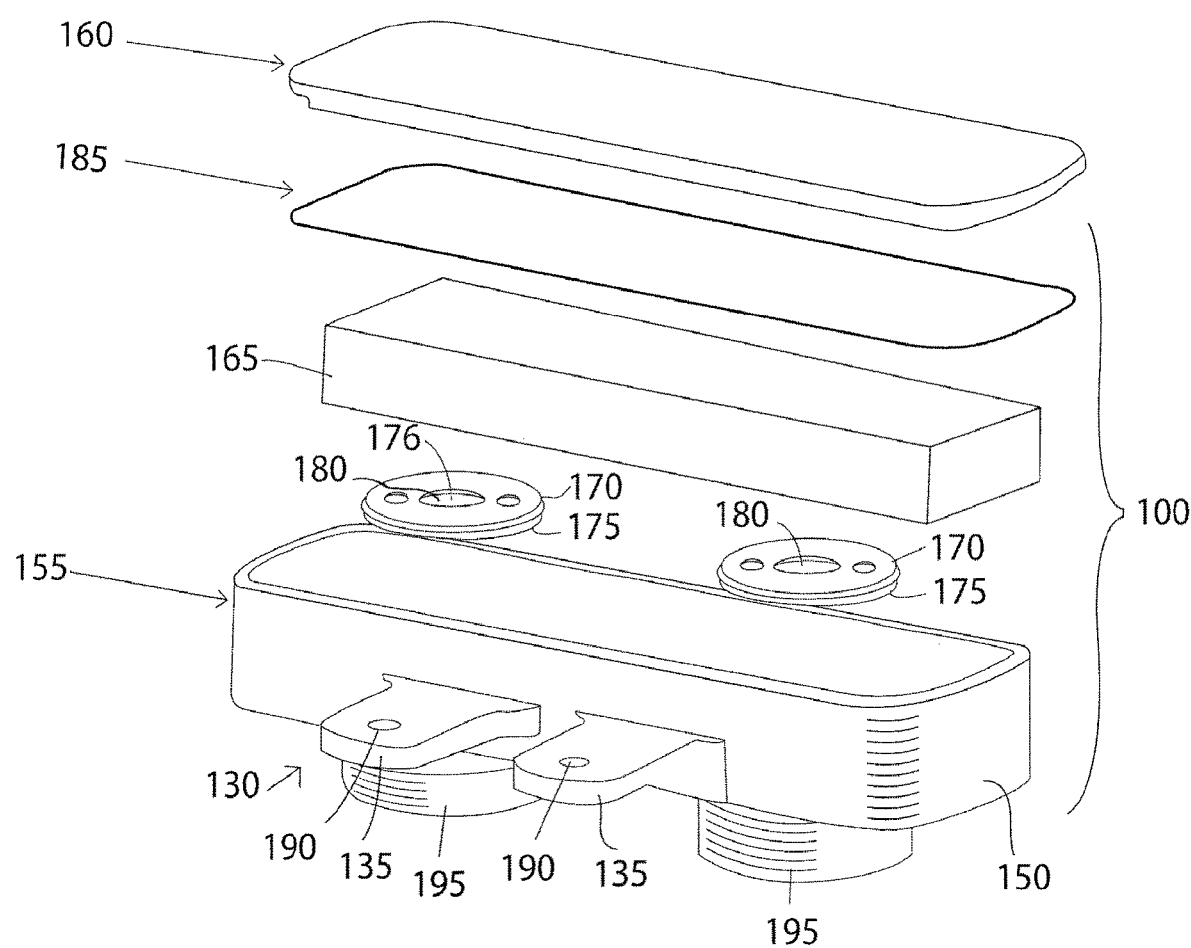
FIG. 4
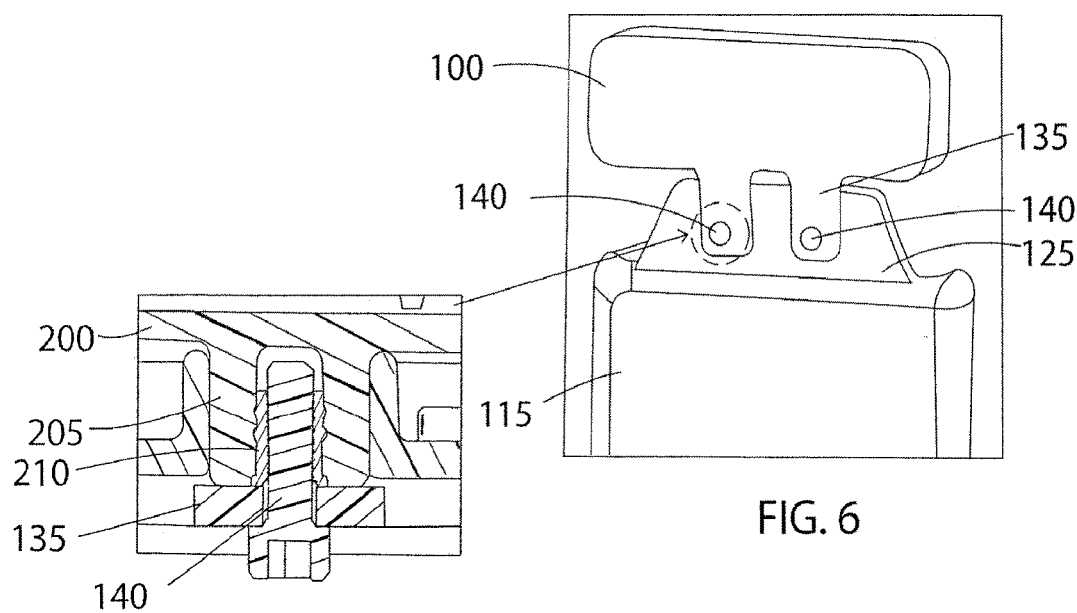
FIG. 5
FIG. 6

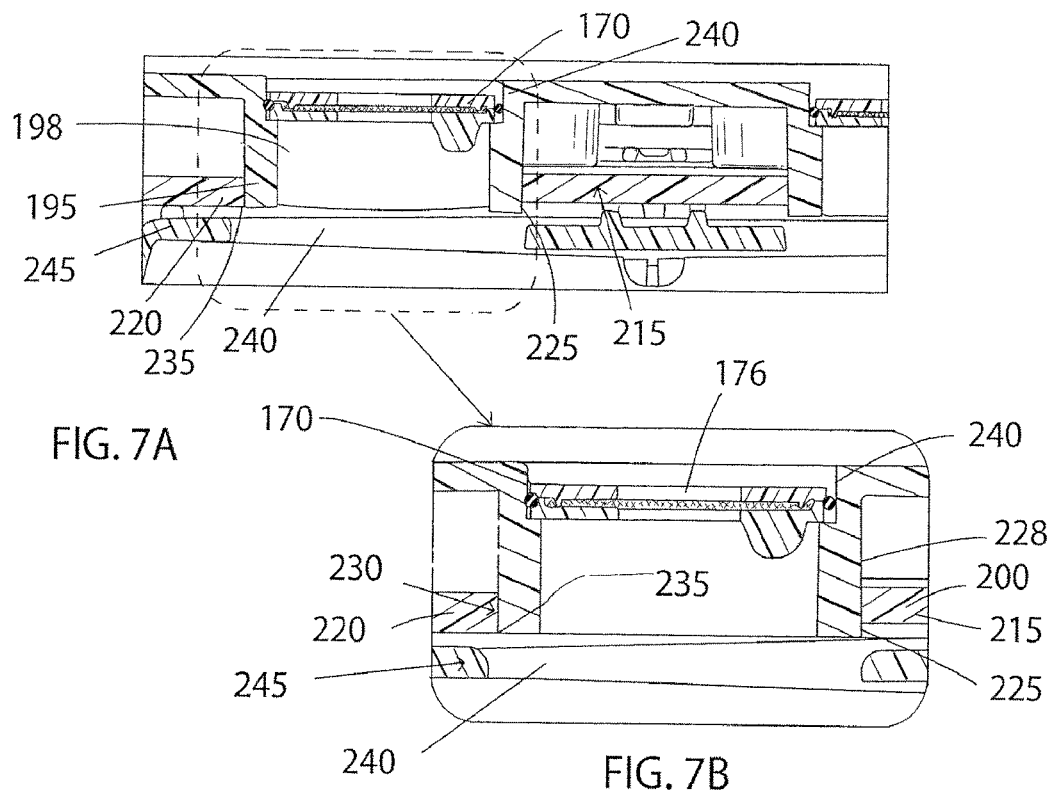
FIG. 7A
FIG. 7B
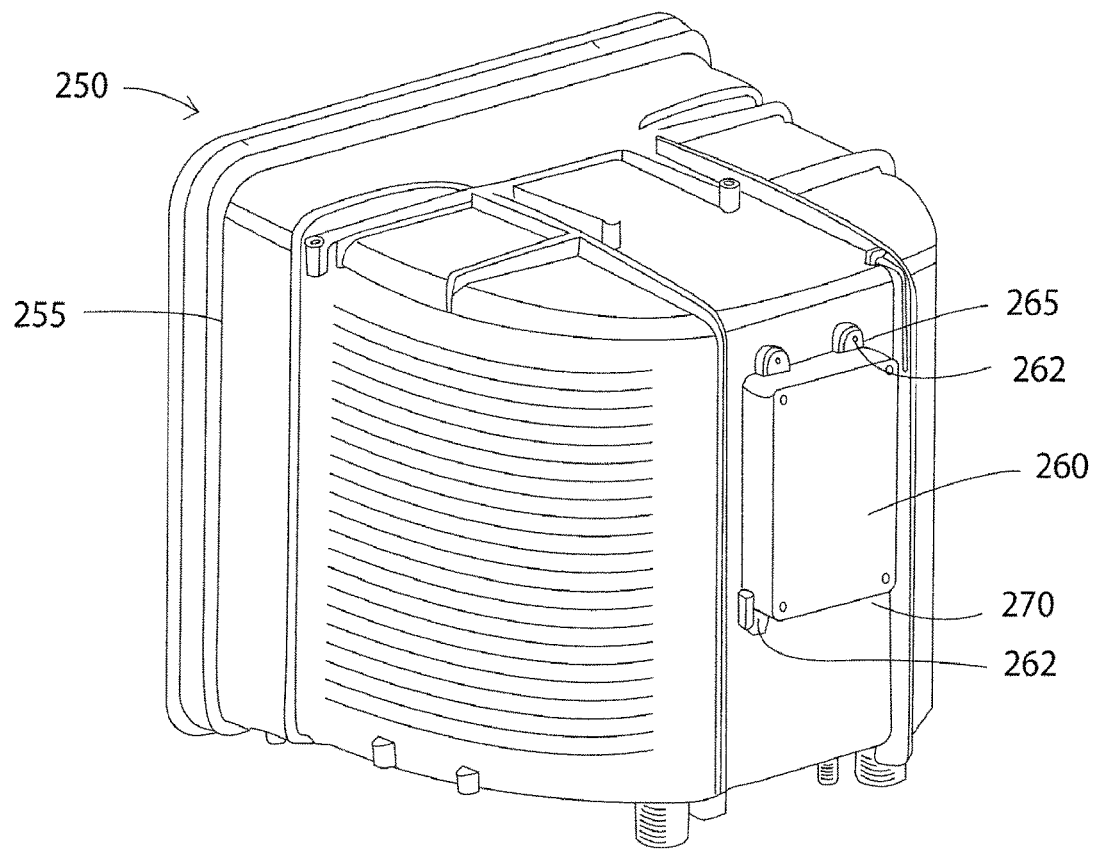
FIG. 8

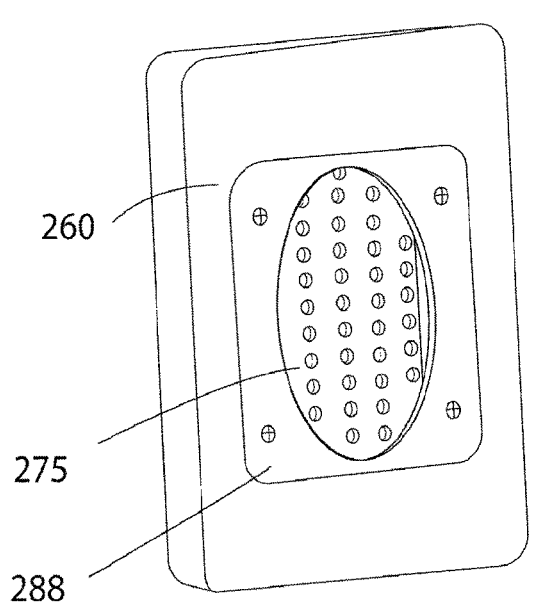
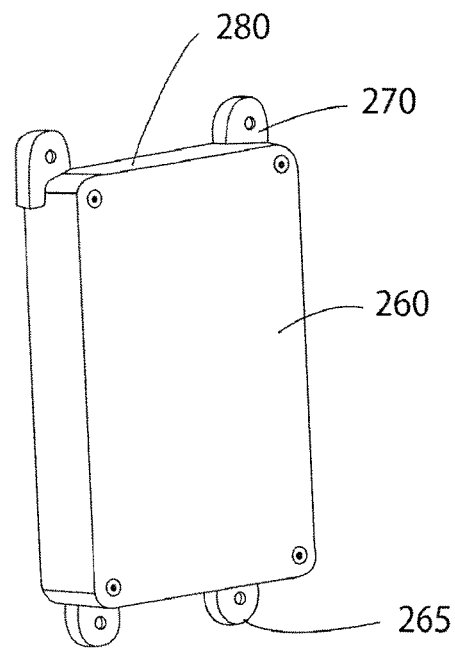
FIG. 9     FIG. 10
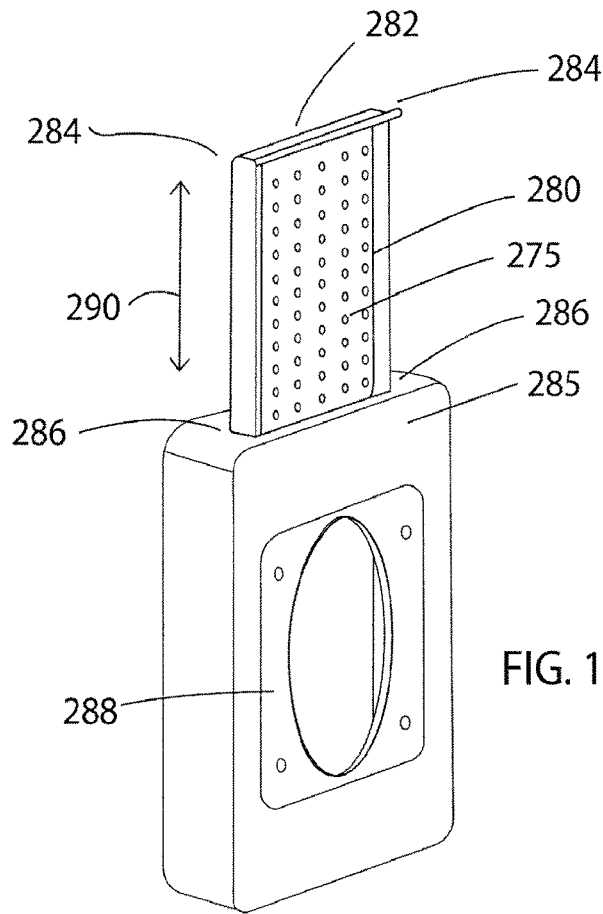
FIG. 11

WAFER CONTAINER WITH EXTERNAL PASSIVE GETTER MODULE

RELATED APPLICATIONS

This application claims the benefit of U.S. Provisional Application No. 62/160,467 filed on May 12, 2015, and which is incorporated by reference herein in its entirety for all purposes.

BACKGROUND

Substrates such as wafers and reticles used in semiconductor processing are highly vulnerable to contaminants, including moisture, volatile organic components (VOC's), and particles. The presence of moisture, for example, can contribute to haze growth on both reticles and wafers. One way to control contaminants, including moisture, is to continually or periodically purge the space within a container where the substrates are stored or secured. During shipping, it has not been considered practical to use purging, and devices such as getters have been used within containers during shipping to keep moisture and VOC's to acceptable levels. Desiccants and other types of getters in substrate containers typically require removal or disassembly before the container is washed, as the fluids used can destroy the desiccants or getters.

Sealed containers known as FOUPs (front opening unified pods), FOSBs (front opening shipping boxes), or SMIF (standard mechanical interface) pods are used as wafer containers or reticle pods. These containers provide a microenvironment to isolate and control the volume surrounding wafers and substrates used in manufacturing integrated circuits. Such containers are available from Entegris, Inc., the owner of this application.

Due to the detrimental effect of moisture, VOC's, and particles on semiconductor production, improvements in the control of such contaminants can be desirable.

SUMMARY

According to embodiments of the disclosure, a semiconductor wafer container assembly includes a container defining an exterior and defining an interior having a wafer storage area adapted to support one or more semiconductor wafers. The container also defines a getter access opening in the container between the exterior and the interior. The container has a container portion including a door and a latching mechanism to sealingly secure the door closed, and the door is openable for access to the wafer storage area. A passive getter module is removably secured with respect to the exterior of the container by substantially rigid connection structure that is a part of or extends from a substantially rigid getter module housing. Getter material is disposed within the housing, the getter material adapted to decrease concentration of contaminants within the wafer storage area of the container via the access opening and the opening in the container. The passive getter module is positioned outside any active purge flow path for the interior of the container and is otherwise sealed except for the access to the interior of the container.

Embodiments of the disclosure provide an assembly including an enclosure containing a microenvironment. The enclosure is outfitted with a getter module installed on the rear face of the enclosure. The getter module is used to decrease concentrations of water, oxygen, and/or other contaminants in the microenvironment. Within the attachment boundary of the enclosure to the getter module, a port hole or egress extends through a shell of the enclosure to allow for environmental exchange between the microenvironment and the getter module. The interface between the enclosure and the module can be sealed with a gasket installed on either the enclosure or the module. Additionally, the enclosure optionally includes a filter between the microenvironment and the getter module, and/or between the getter module and the external environment. The getter module can be installed on the enclosure by various methods, including fasteners, snap fit, press fit, and/or interference fit. The getter module can be consumable, or a separate, replaceable cartridge. Multiple getter modules are optionally used on a single enclosure to scavenge various species of contaminants.

The wafer container comprises a container portion with an open front, a closed back wall, a plurality of horizontal wafer supports in an interior, and a door to latch to and seal at the open front. An externally mounted module enclosure is attached to the back wall at a getter access opening, the module enclosure including a getter therein that is in communication only with the interior of the container. The getter may be removable from the module enclosure for renewing the getter without detaching the module enclosure.

Embodiments of the disclosure can be used with a variety of shippers or other containers or containers accommodating different wafer sizes, for example 150 mm, 200 mm, 300 mm and 450 mm silicon wafers, to name several examples. Other aspects of the disclosure will be apparent to those of ordinary skill upon reading this disclosure, and this Summary should not be considered limiting.

BRIEF DESCRIPTION OF THE DRAWINGS

FIG. 4 is an exploded perspective view of a getter module, according to an embodiment of the invention.

FIG. 5 is a partial cross-sectional view showing connection structure between a getter module, an identification plate, and a container boss, according to an embodiment of the invention.

FIG. 6 is a perspective view of a getter module, according to an embodiment of the invention.

FIGS. 7A-7B are partial cross-sectional views of connection structure between a getter module and a container, according to an embodiment of the invention.

FIG. 8 is a perspective view a container assembly, according to an embodiment of the invention.

FIG. 9 is a perspective view of a getter module of the FIG. 8 container assembly, according to an embodiment of the invention.

FIG. 10 is an alternative perspective view of the FIG. 9 getter module, according to an embodiment of the invention.

FIG. 11 is a perspective view of the getter module shown in FIGS. 9-10 with an extended tray, according to an embodiment of the invention.

DETAILED DESCRIPTION

Figure 1:
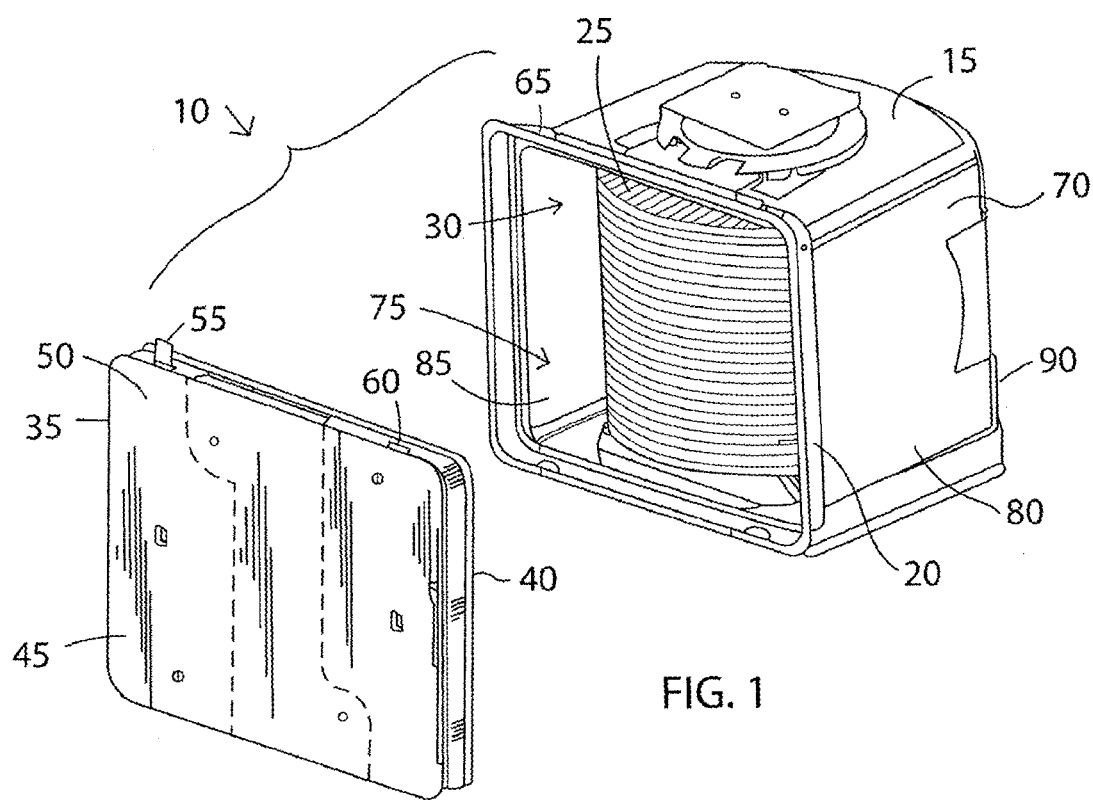
FIG. 1 is a front perspective view of a container assembly with a door, according to an embodiment of the invention.

Uncontrolled concentrations of moisture, oxygen, airborne molecular contaminants (AMC's), volatile organic compounds (VOC's), or other foreign matter within the interior of wafer container microenvironments can lead to circuit defects and reduced yield. Getters, including desiccants, are used to control and reduce such concentrations. In some wafer containers, for example 450 mm or larger wafer containers, there can be insufficient space at the rear face of the container for placement of a getter, and there also can be insufficient space within the container for a 26th or other additional wafer slot for accommodating a disc outfitted with a getter. Certain embodiments of the disclosure address these issues by providing one or more passive getter or desiccant modules/cartridges on an external surface of the wafer container, fluidly communicating with an interior of the container and positioned outside of any active purge flow stream that may be used to purge the interior of the container.

More specifically, a getter module, assembly or cartridge includes a housing or enclosure provided with getter material and installed on an exterior of a microenvironment container. The getter material is used to scavenge various chemicals or humidity/moisture, or otherwise decrease concentrations of contaminants or other foreign matter within the container. One or more getter modules can be attached to the exterior in multiple locations. Threaded, friction-fit, snap-fit, adhesive, and other connections can be used to attached getter modules to the back wall, side wall, top, bottom, door or other location on the exterior of the container. The getter modules can be consumable or single-use commodity-type items; they can also be reused or replenished from use-to-use of a specific microenvironment container. Certain embodiments refer to the exteriorly mounted getter modules as getter backpacks.

Embodiments of the disclosure can provide advantages such as increased wafer yield and prolonged microenvironment protection from moisture, oxygen, acids, bases, and other contaminants. Installing getter modules externally on a container eliminates or reduces a need to provide room for such modules internal to the container, in certain situations. Multiple different getter modules can be configured and arranged to scavenge various chemicals on an as-needed basis, and getter modules can be replaced from outside the container, without intruding into the interior of the container nearer to wafer handling volumes.

It should be noted that embodiments of the disclosure are not limited for use with semiconductor materials, wafers or other substrates, or containers. Embodiments of the disclosure are useful for protecting any items that should be transported in a clean, uncontaminated or otherwise protected state, and such embodiments are applicable in a variety of industries and other settings beyond the semiconductor industry. The term substrates as used herein includes wafers processed into integrated circuits, solar panels, flat panels, or other semiconductor devices; substrates also include reticles used in lithography and disks used in memory disks, such as hard drives, and any other items to be protected. Embodiments of the disclosure are applicable to a wide variety of industries and a wide variety of contaminant-sensitive items, not just the semiconductor industry and semiconductor wafers. For example, embodiments of the disclosure also apply to the life sciences and bio/pharma industries. Further, the terms container, container, shipper, cassette, transport/storage bin, and the like, are also used interchangeably herein unless otherwise indicated. Still further, the terms getter module, getter cartridge, and getter assembly are used interchangeably herein, and the term getter material includes a wide variety of materials, listed above, and including but not limited to desiccant material.

Turning to the figures, FIG. 1 is a front perspective view of substrate container assembly 10 configured as a wafer container, according to an embodiment of the disclosure. Assembly 10 includes container 15 adapted to support one or more semiconductor wafers 20 or other substrates in stack 25 within microenvironment or wafer storage area 30. Container 15 has door 35 for sealingly closing container 15 and for opening container 15 to allow access to wafer storage area 30. Door 35 has interior side 40, facing wafer storage area 30, and exterior side 45, facing away from wafer storage area 30. Door 35 includes door housing 50 with a latching mechanism including tabs 55 extending from apertures 60 into corresponding recesses 65 in container 15 to secure door 35 closed. Container 15 defines exterior 70 and interior 75. Wafer storage area 30 is disposed within container interior 75. Container 15 includes side walls 80, 85, with door 35 and back wall 90 extending between side walls 80, 85. Back wall 90 is opposite door 35.

In the illustrated embodiment, container assembly 10 is a front opening wafer container known as a FOUP (front opening unified pod). Other types of container assemblies according to embodiments of the disclosure include FOSBs (front opening shipping box), SMIF pods (standard mechanical interface pods), horizontal wafer shippers, single wafer shippers, universal wafer shippers, or any other type of container for semiconductor disks or wafers, as well as containers for flat panels, glass panels, reticles, printed circuit boards, and other similar substrates, or for other items. Examples of such containers are described in U.S. Pat. Nos. 4,815,912, 4,995,430, 5,788,082, 6,010,008, and 6,354,601, all owned by the owner of this application and all incorporated herein by reference in their entirety for all purposes. Various getters in a SMIF pod enclosure are illustrated in U.S. Pat. No. 5,346,518, which is incorporated herein by reference in its entirety for all purposes.

Figure 2:
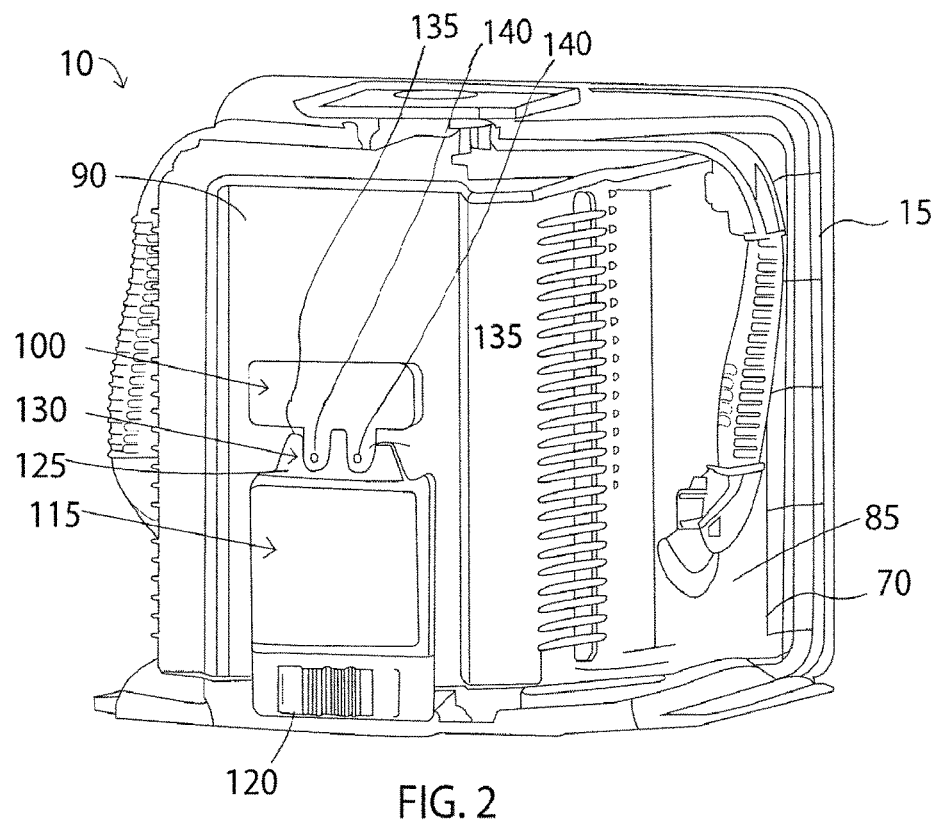
FIG. 2 is a rear perspective view of a container assembly, according to an embodiment of the invention.
Figure 3:
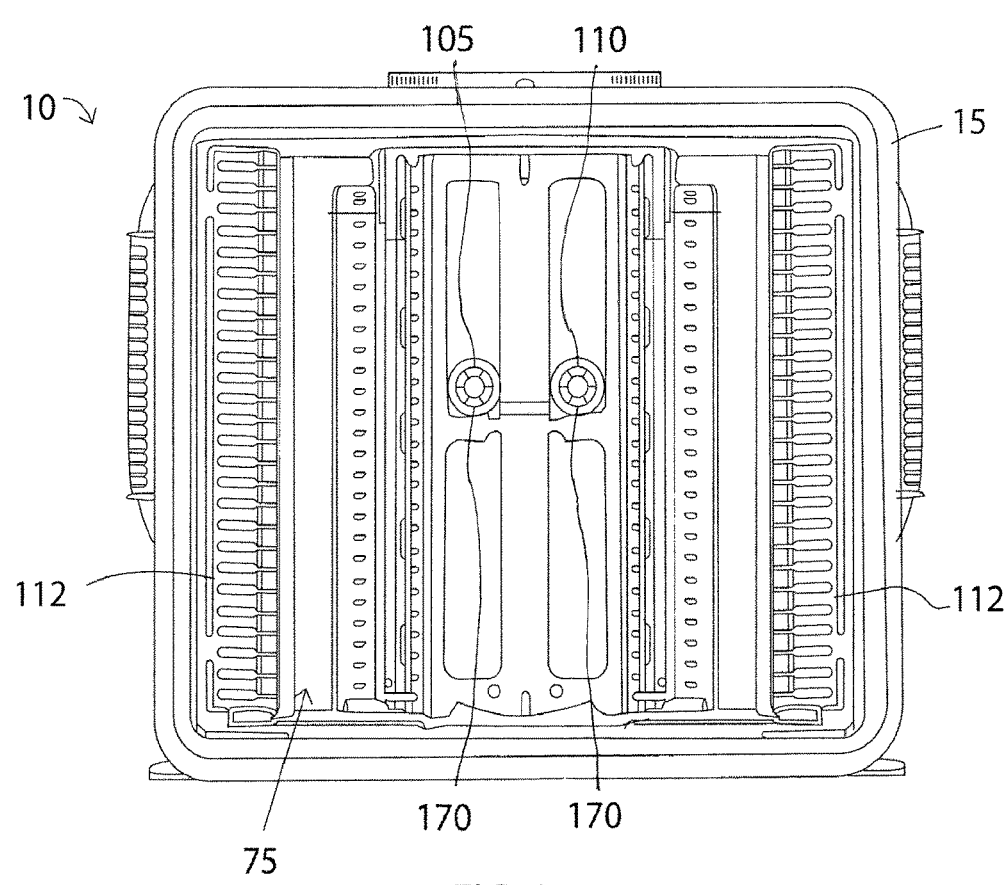
FIG. 3 is a front view of the container assembly of FIG. 2, according to an embodiment of the invention.

FIGS. 2-3 are more detailed rear and front views of a container assembly 10 according to an embodiment of the invention, showing passive getter module 100 mounted with respect to exterior 70 of container 15. Container 15 defines getter access openings 105, 110 (FIG. 3) between exterior 70 and interior 75 of container 15 for receiving or connecting to module 100. Wafers in stack 25 of wafers rest on wafer supports 112 (FIG. 1). According to the illustrated embodiment, openings 105, 110 enter container 15 at or about the position of a 15th wafer in wafer stack 25, or slightly above the midpoint of stack 25. This position is advantageous for a container containing a stack 25 of 300 mm wafers, according to one embodiment. Other size wafers may benefit from different placement of openings 105, 110. For example, 450 mm wafers may benefit from placement of openings 105, 110 in a bottom face of container 15 or in door 35 of container 15, due to space limitations. Openings 105, 110 optionally are placed closer to the bottom of container 15 than illustrated to address other factors, for example in the event that heavier contaminants are potentially likely within wafer storage area 30. Openings 105, 110 optionally are placed closer to the top of container 15 than illustrated in the event that lighter, more volatile contaminants are more potentially likely within area 30. Each opening 105, 110 is a port, hole or egress that allows for environmental exchange between the microenvironment within container 15 and module 100.

Container assembly 10 includes license plate 115, which contains, includes, or is associated with information about container 10 and/or its contents. Bar code 120 is an example of such information, disposed on the outside of license plate 115 or immediately adjacent structure as illustrated. Flange or tab 125 extends from license plate 115 and is attached to connection structure 130 extending from or formed as part of getter module 100, specifically to two mounting flanges 135 of getter module 100. Fasteners 140 secure mounting flanges 135 to license plate flange 125. Thus, passive getter module 100 is mounted on or otherwise secured to license plate 115.

As shown in FIG. 4, getter module 100 includes housing 150 with base 155 and cover 160. Getter material 165, for example including desiccant material, is disposed within housing 150. Getter material 165 includes a self-contained portion of one or more getter materials pressed or otherwise formed into a unitarily removable unit, such as a bag, pack, wafer, or cake, according to various examples, for easy insertion into or removal from base 155. Alternatively, powder, granular, or other forms of getter or desiccant material 165 are suitable for use instead of a self-contained form.

Filter material, optionally in the form of one or more filter disk packs 170, also is disposed in base 155, on the container side of getter material 165 according to one embodiment. Each filter disk pack has outer housing 175 and filter material 180 secured within housing 175, the housing defining windows 176 for environmental exchange. Certain filter disk packs 170 suitable for use according to embodiments of the disclosure are available for use in purge applications from Entegris, Inc., the owner of this application, but are re-purposed here for a non-purge application. Filter disk packs 170 substantially prevent particle exchange between module 100 and container 15, for example with respect to particles generated by getter material 165, but without substantially impeding flow between module 100 and container 15. Filter disk packs 170 provide both inside-out and outside-in protection, serving to filter out particulate matter and substantially reduce contamination of getter material 165 with outside particles, and also serving to retain any particles within housing 100 to prevent corresponding contamination of the microenvironment within container 15.

Cover 160 is substantially sealed or otherwise connected to base 155 by adhesive, ultrasonic or other welding, or other mode. Seal or O-ring 185 is optionally disposed between cover 160 and base 155 to sealingly connect cover 160 and base 155 in a fluid-tight manner. Cover 160 is optionally removably attached to base 155, for example with a snap-fit connection, such that getter material 165 or other components within housing 150 are replaceable or replenishable from time-to-time or use-to-use and yet secured within housing 150 when in use.

Connection structure 130 for connection of getter module 100 to container 15 includes mounting flanges 135, referred to above, having apertures 190 for receiving fasteners 140. Connection structure 130 also includes getter module bosses 195, extending from or as part of getter module 100, for alignment with openings 105, 110 in container 15. Bosses 195 are substantially hollow or open and define access openings 198 (FIG. 7A) fluidly connecting with the interior of getter module 100 while in use. Bosses 195 are substantially cylindrical, according to the illustrated embodiment, and are shaped to receive filter disk packs 170 and hold them in substantial alignment with openings 105, 110 in container 15, as shown in FIG. 3. Other shapes for bosses 195 are also contemplated, for example substantially square, rectangular, polygonal, oval, or other shapes. Connection structure 130 is adapted to removably and sealingly secure getter module 100 with respect to exterior 70 of container 15 and to fluidly connect access openings 198 within bosses 195 to the openings 105, 110 in container 15. More specifically, getter material 165 is arranged to passively decrease concentration of contaminants within wafer storage area 30 of container 15 via access openings 198 within bosses 195 and openings 105, 110 in container 15.

Getter module 100 decreases concentration of contaminants within container 15 free of any active purge flow through getter module 100, according to the illustrated embodiment. As shown, getter module 100 is outside any purge flow path for container 15, and is not located within a purge port, purge tube, or other path by which interior 75 of container 15 is flushed or purged. Getter module 100 is sealed against the ambient environment surrounding container 15, and getter material 165 is in communication only with interior 75 of container 15. Embodiments of the disclosure provide advantages in being able to reduce contaminant concentration within container 15 while container 15 is in shipment from one destination to another, for example, or is otherwise disconnected from a source of purge gas or fluid.

FIG. 5 is a partial cross-sectional view showing detail of a connection between fasteners 140 and container 15 in the general area shown in FIG. 6. Container 15 includes shell 200 defining an exterior surface of container 15. Bosses 205 extend from shell 200 and receive inserts 210 for receiving fasteners 140 via threaded fit, snap fit, or other desired mode of fastening. Inserts 210 are secured within bosses 205 by ultrasonic welding, for example. Other types of securement are also contemplated. Fasteners 140 are tightened to secure mounting flanges 135 of getter module 100 against flange 125 of license plate 115, and flange 125 against bosses 205 of container 15. For simplicity of illustration, flange 125 is eliminated from FIG. 5, and mounting flange 135 of getter module 100 is illustrated as attached directly to bosses 205, for example in keeping with a testing environment for module 100. Inserts 210 and fasteners 140 are optionally formed of a PEEK (polyether ether ketone) material, another suitable polymer, or other desired material. Bosses 205 are optionally originally intended to connect to license plate 115 and can be adapted or retrofitted with inserts 210 to additionally engage and secure fasteners 140 and/or getter module 100.

FIGS. 7A-7B show detail of the connection between bosses 195 of getter module 100 and corresponding openings 105, 110 in container 15. Container shell 200 includes contoured or arcuate portion 215 in the region of getter module 100 between getter module bosses 195, and contoured or arcuate portion 220 outside of bosses 195. The surface of module 100 facing portions 215, 220, however, is substantially flat, according to embodiments of the invention. To accommodate the differing surface shapes of module 100 and container 15, openings 105, 110 are tapered such that portion 220 of shell 200, on the opposite side of boss 195 relative to portion 215, is set back relative to portion 215. Overlap 225 thus is created on the inside portion of each getter module boss 195, whereas outside portion 230 of each getter module boss 195 generally aligns with shell portion 220, as shown at 235. Openings 240 in rear cushion 245 of container 15, as shown in FIGS. 7A-7B, are tapered similarly.

According to embodiments of the invention, bosses 195 of getter module 100 are press-fit or interference fit into tapered openings 105, 110 to create a sealing connection with respect to the curved outside surface of the FOUP or other container 15. According to one embodiment, the curved nature of the outside surface favors use of an interference fit, as shown, instead of an O-ring, gasket or other substantially flat sealing device, although the latter are also contemplated for use according to embodiments of the invention. The combination of an interference fit between getter module bosses 195 and container openings 105, 110, and a threaded or other fit using fasteners 140 between module 100, license plate 115, and/or container bosses 205, provides sufficient support for module 100 to maintain sealing connection into container openings 105, 110 despite vibrations, impact loads or other adverse factors.

Also as shown in FIGS. 7A-7B, access opening 198 within each getter module boss 195 includes widened portion 240 at a proximal end thereof, to securely accommodate filter disk pack 170 while still providing maximum space for getter material 165 disposed in base 155.

FIGS. 8-11 show an alternative embodiment of the disclosure in which container assembly 250 includes container 255 with getter module or cartridge 260 secured externally thereto. According to the illustrated embodiment, fasteners 262 extend through first and second sets of lugs 265, 270 to secure module 260 to container 255. Getter material 275 is supported by tray 280 for insertion into and removal from housing 285 of module 260, linearly along directional arrow 290 shown in FIG. 11. Tray 280 thus is adapted to slide linearly into and out of an interior of getter module or cartridge 260. Tray 280 includes end 282 having mounting lugs 284 for securement within corresponding recesses 286, with screws or other fasteners, for example, to hold tray 280 closed. Getter material 275 can be of various types and in a variety of form factors, as described previously, and is easily removed and replaced with a fresh getter material if/as needed. According to one embodiment, getter material 275 is formed of CLARILITE material, available from Entegris, Inc. CLARILITE is a registered trademark of Entegris, Inc. Gasket material 288, and/or a suitable O-ring or other seal, is optionally used to help sealingly connect module 260 to container 255. Other features and advantages of the embodiment illustrated in FIGS. 8-11 will be apparent from the previously described embodiments, including the feature that getter module or cartridge 260 is passive, reducing contaminant levels within container 255 without active purge flow through the module.

Figure 12:
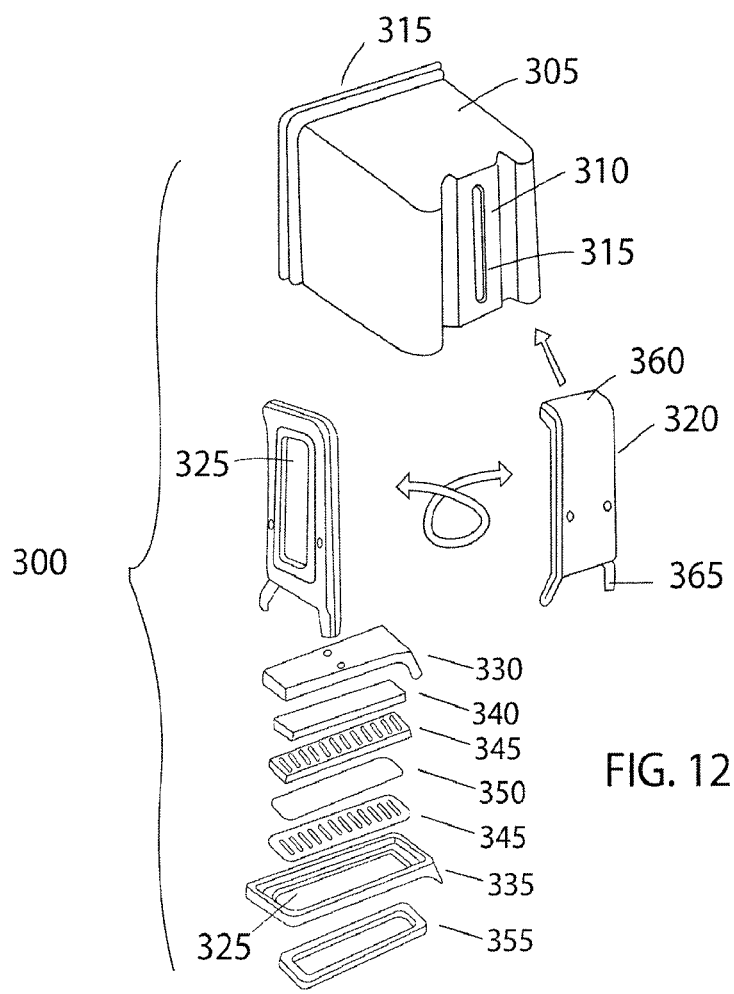
FIG. 12 is an exploded perspective view of a container assembly, according to an embodiment of the invention.

FIG. 12 illustrates an additional container assembly 300 including container 305. Container 305 includes back wall 310 disposed opposite front opening 315. Back wall 310 includes elongated aperture 315, which extends substantially vertically, or lengthwise, along substantially or nearly an entire height of back wall 310. Width-wise orientation of aperture 315 on back wall 310 is also contemplated, according to embodiments of the invention, but lengthwise orientation provides greater aperture length in the illustrated embodiment. Getter/desiccant cartridge 320 includes access opening 325 for exposing getter material within cartridge 320 to the interior of container 305 via aperture 315. Cartridge 320 includes top enclosure 330 secured to bottom enclosure 335, in which opening 325 is formed. Secured between top enclosure 330 and bottom enclosure 335 are desiccant or getter material 340, and grates or filter frames 345 supporting filter material 350. Sticky seal 355 substantially surrounds opening 325 and serves to help secure cartridge 320 to the exterior of container 305. Structural features extending from top and/or bottom enclosures 330, 335, for example flange 360 and legs 365, also help secure cartridge 320 to container 305.

Figure 13:
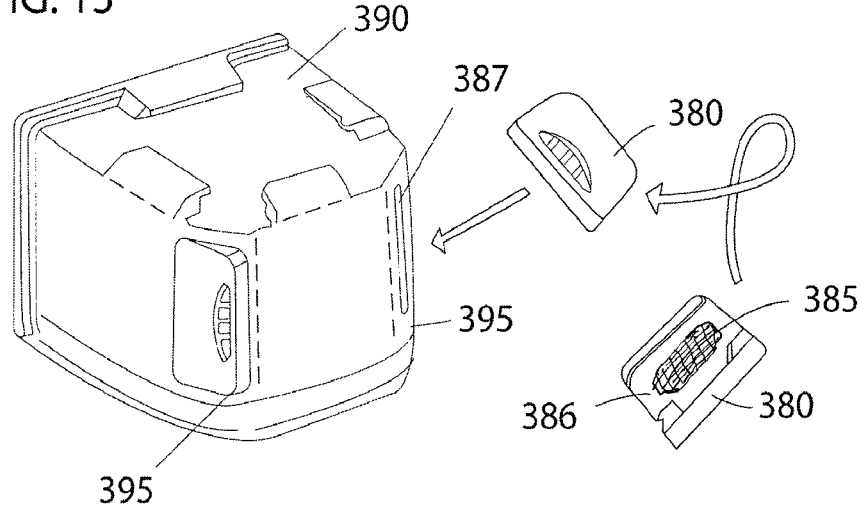
FIG. 13 is a perspective view of a container assembly, according to an embodiment of the invention.

FIG. 13 shows another alternative embodiment, in which two getter cartridges or modules 380 having getter material 385 accessible through access openings 386 are secured over one or more elongated apertures 387 on container 390. Apertures 387 are disposed on angled side walls 395 of container 390 to sealingly and passively expose getter material 385 to the interior of container 390 through access opening 386 and aperture 387, in the manner previously described. Other features and advantages of these embodiments will again be apparent from the previously described embodiment, including the feature that getter module or cartridge 260 is passive, reducing contaminant levels within container 255 without active purge flow through the module.

With embodiments disclosed herein, the getter material is adapted to decrease concentration of contaminants within the container, specifically in the wafer storage area of the container. More specifically, getter material scavenges gas, moisture, humidity, airborne molecular contaminants (AMC), volatile organic compounds (VOC) and/or other unwanted contaminants or substances that may have a detrimental effect on items or process within the container and container assembly. AMC's that can be controlled according to the disclosure include acids and bases (e.g. $NH_3$ and $SO_4$), biotoxins, condensable or corrosive contaminants, VOC's, dopants, and other categories of such contaminants or substances. Additionally, different types of getter packs or other form of getter material can be chosen to scavenge or decrease concentrations of specific types of contaminants or substances, as may be needed in particular applications. A user of the container assemblies disclosed herein can pick and choose different getter material or getter modules depending on the types of contaminants to be controlled, and/or depending on the specific items or processes occurring within the container assembly.

Examples of getter material suitable for use according to embodiments of the disclosure include that used in CLARILITE wafers, mentioned above and available from Entegris, Inc., which fit in wafer slots within FOUPs and FOSBs to absorb contaminants and moisture. CLARILITE is a registered trademark of Entegris, Inc. Examples of getter material and container assemblies suitable for use also are disclosed in commonly assigned U.S. Pat. Nos. 6,447,584; 6,740,147; 6,610,128; and 6,761,753; 8,776,841; 8,783,463, Patent Cooperation Treaty Application No. PCT/US2014/054399, filed Sep. 5, 2014, and U.S. Patent Application No. 62/131, 478, filed Mar. 11, 2015, all owned by the owner of this application and all incorporated herein by reference in their entirety for all purposes. For example, adsorptive media for the getter can include, without limitation, a filter, chemisorptive and/or physisorptive media and combinations thereof.

The filter can provide retention of the media as well as separation of the media from the interior of the substrate container. In an embodiment of the disclosure, the getter is a filter material, activated carbon, and a chemisorptive material. Features of the embodiments herein may also be applicable to exteriorly mounted getters with active purging through the getter material and such alternate embodiments are part of the disclosure herein.

Getter material according to embodiments of the disclosure may be in the form of granular desiccants, rigid plates, absorbent disks, molecular sieves, and/or polymer matrices holding desiccant or molecular sieve material, to name several examples. The getter material also optionally includes a polymer base, a channeling agent and/or a desiccant. In certain embodiments the polymer is a thermoplastic polymer. Thermoplastic polymers include acrylics such as poly(methyl methacrylate) (PMMA); polyamides, such as nylon; polybenzimidazole (FBI); polyethylene, including ultra-high molecular weight polyethylenes (UHMWPE), high-density polyethylene (HDPE), and low-density polyethylene; polypropylene (PP); polystyrene; polyvinyl chloride (PVC); and polytetrafluoroethylene (PTFE). The channeling agent is a compound which is not soluble in the polymer and is used to form passages through the polymer that are communicable with the desiccant. Examples of such channeling agents include, but are not limited to, ethylene-vinyl alcohol (EVOH) and polyvinyl alcohol (PVOH). Examples of desiccants include anhydrous salts that form crystals that contain water, reactive compounds that undergo chemical reaction with water to form new compounds, and physical absorbers which have a plurality of microcapillaries therein and so wick moisture out of the environment. Examples of such absorbers include molecular sieves, silica gels, clays and starches. In embodiments, activated carbon may be the absorbing material, particularly for VOC's. Embodiments of the disclosure can substantially reduce the amount of oxygen, humidity, moisture, VOC's and other contaminants within the associated shipper or other container.

Figure 14:
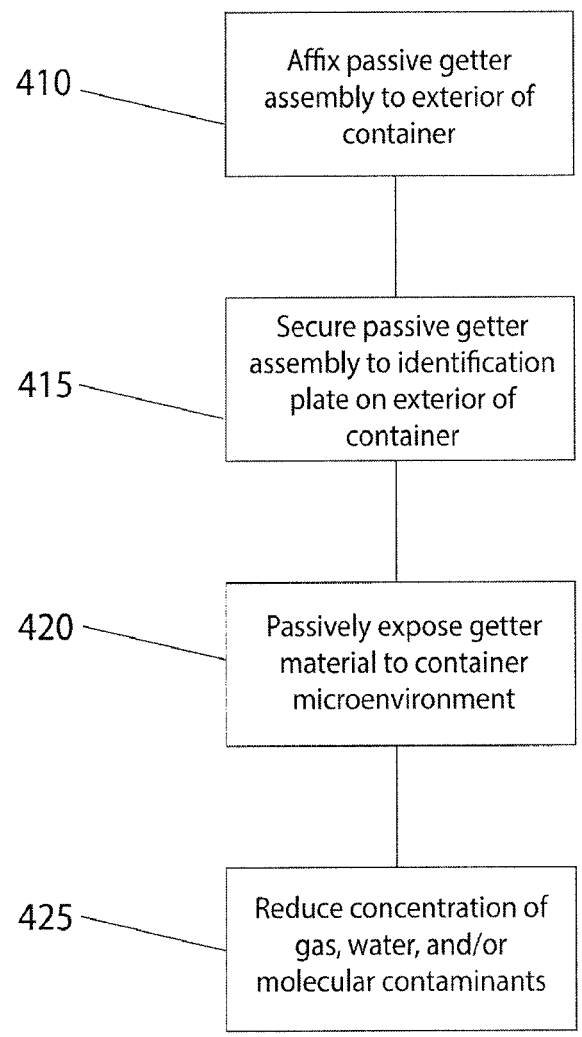
FIG. 14 is a flow chart showing a method according to an embodiment of the invention.

FIG. 14 shows method steps according to an embodiment of the invention. A method of reducing concentration of gas, moisture, and/or other airborne molecular contaminants within a container microenvironment includes affixing, at 410, a passive getter assembly to an exterior of a container. The passive getter assembly includes getter material within a housing, and the affixing includes sealingly connecting the passive getter assembly to an opening between the exterior of the container and the container microenvironment. The method optionally includes securing, and 415, the passive getter assembly to an identification plate disposed on the exterior of the container. The method also includes, at 420, passively exposing the getter material to the container microenvironment and thereby reducing concentration of gas, water, and/or airborne molecular contaminants within the container microenvironment. The method also optionally includes sliding the getter material out of the housing, replacing the getter material with new getter material, and sliding the getter material back into the housing.

Embodiments of the disclosure are especially useful in non-purge, passive environments. With such embodiments, the externally mounted getter modules are free of connection to purge ports or other purge components and thus are out of a purge stream. The containers with which such passive getter modules are used, however, can themselves contain microenvironments in which purge gases and systems are used to actively reduce concentration of contaminants.

Figure 15:
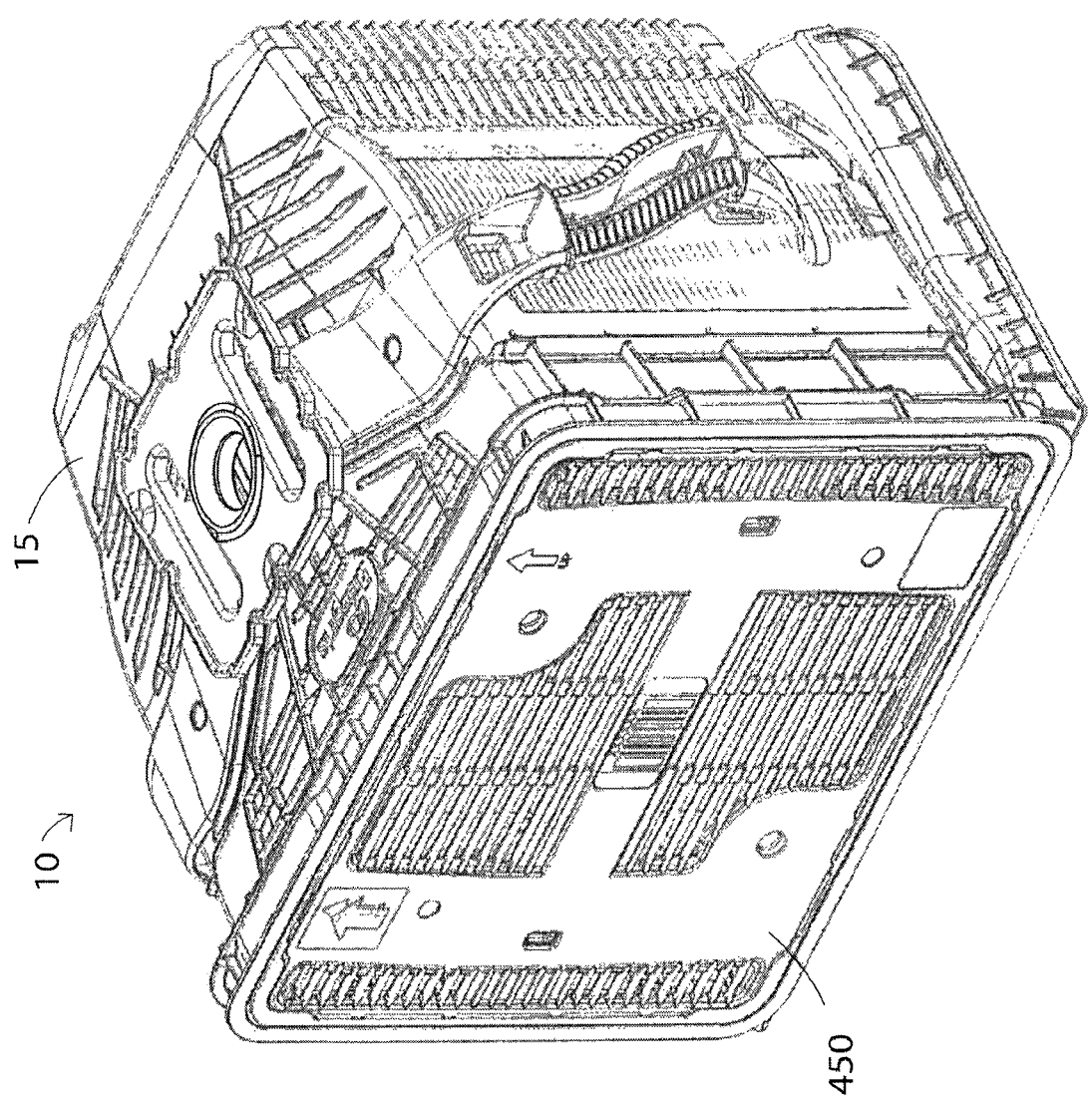
FIG. 15 is an upper front perspective view of a container assembly, according to an embodiment of the invention.
Figure 16:
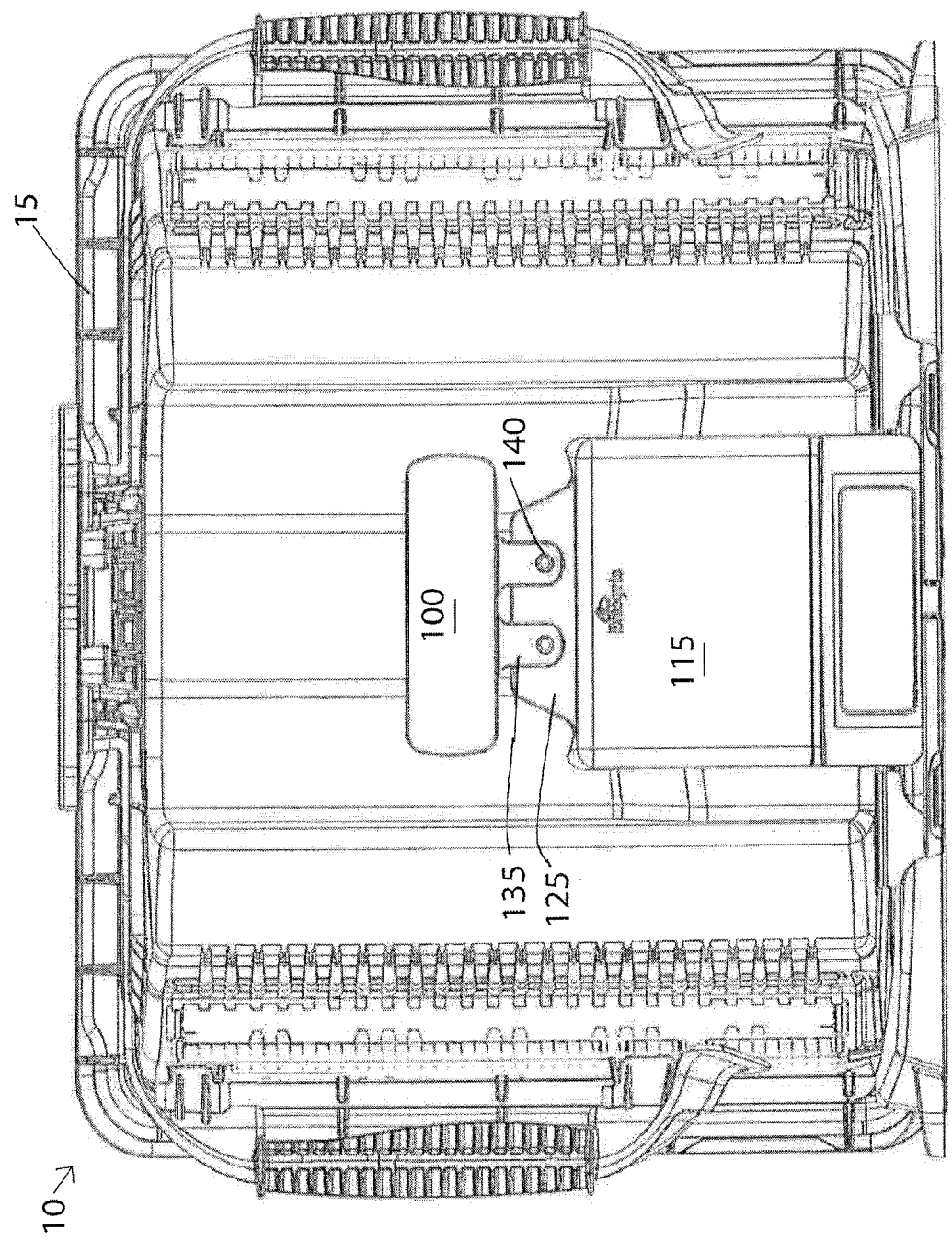
FIG. 16 is a rear view of the FIG. 15 container assembly, according to an embodiment of the invention.
Figure 17:
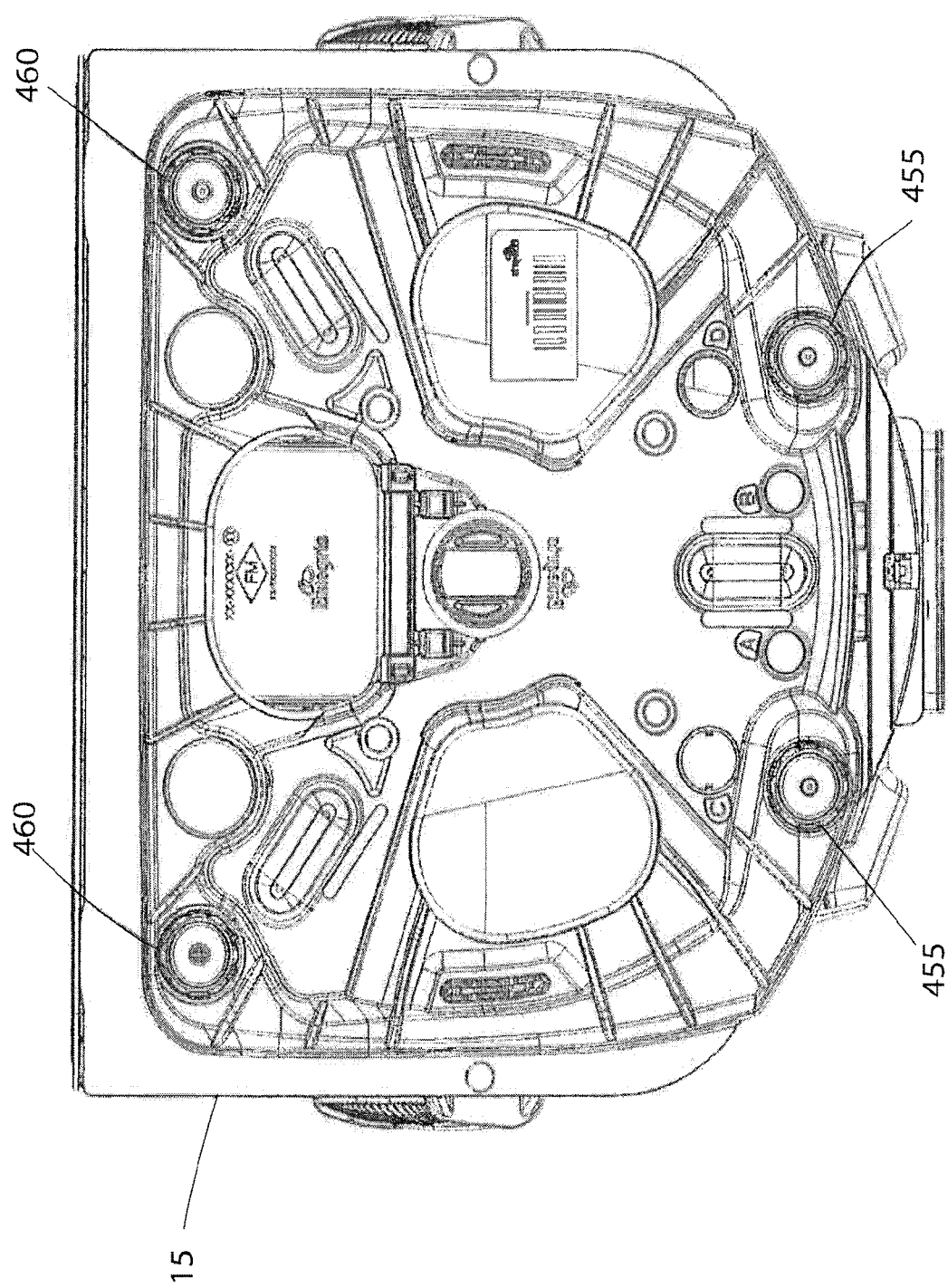
FIG. 17 is a bottom view of the FIG. 15 container assembly, according to an embodiment of the invention.
Figure 18:
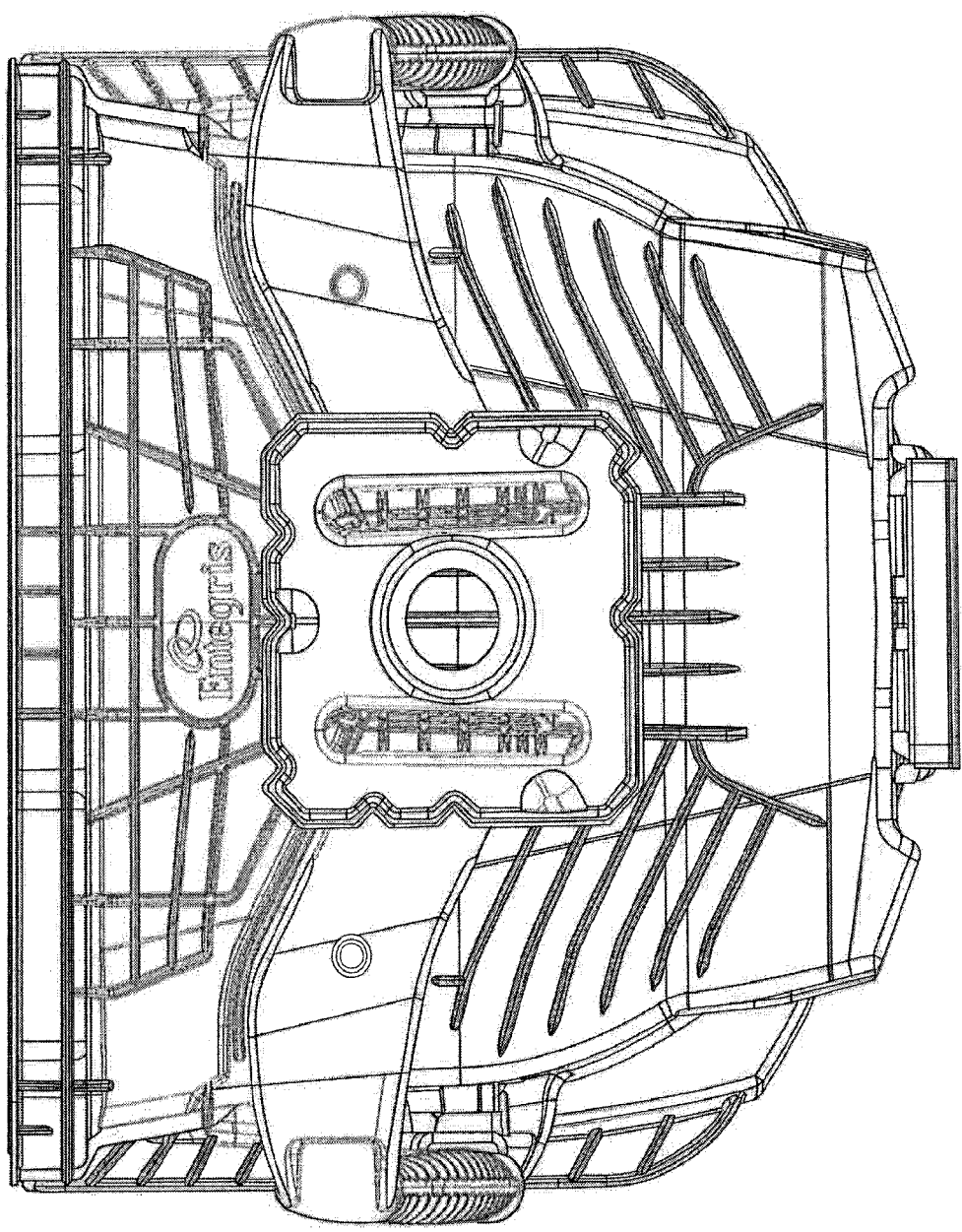
FIG. 18 is a top view of the FIG. 15 container assembly, according to an embodiment of the invention.
Figure 19:
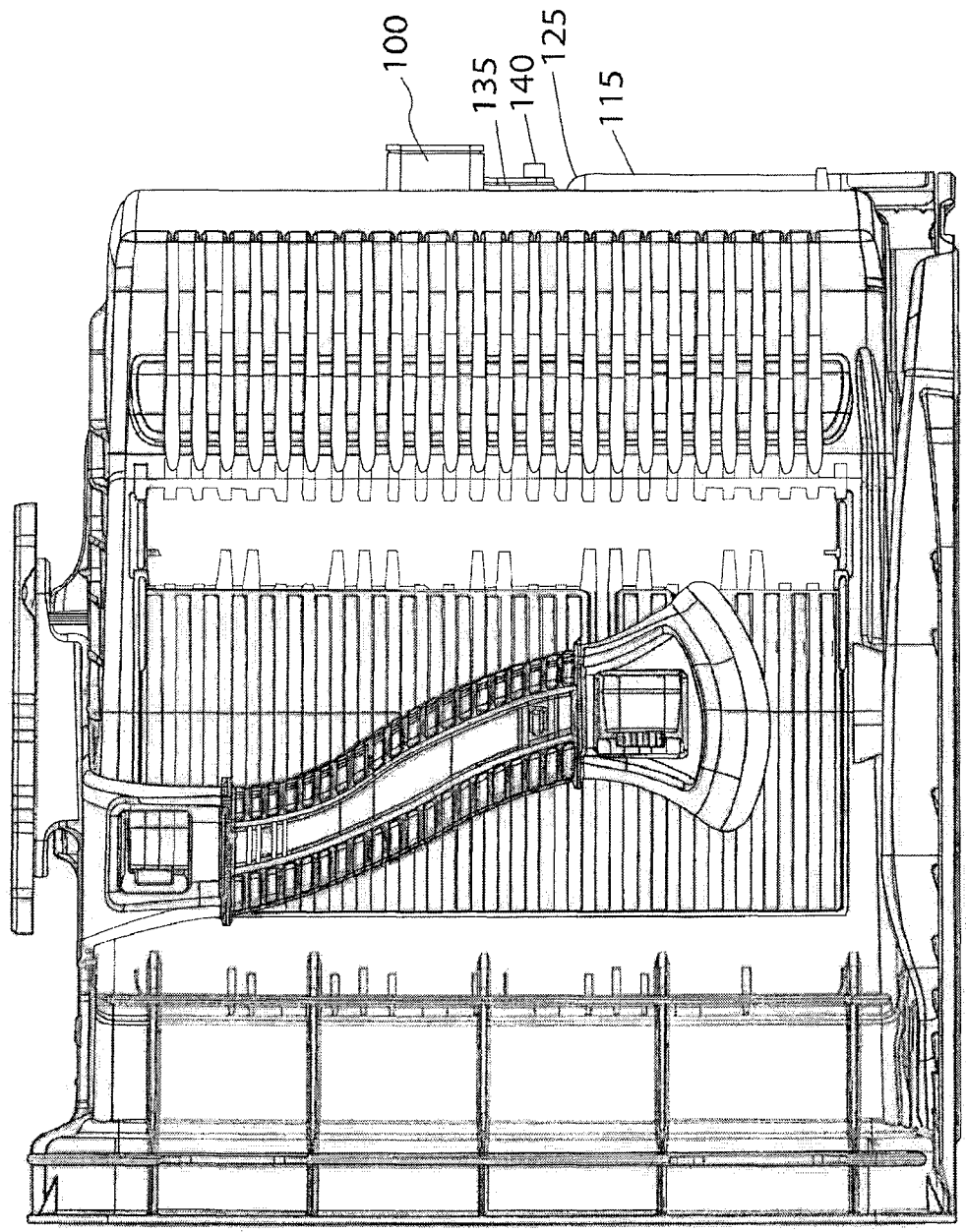
FIG. 19 is a right side view of the FIG. 15 container assembly, according to an embodiment of the invention, the left side view being a substantial mirror image of the right side view.
Figure 20:
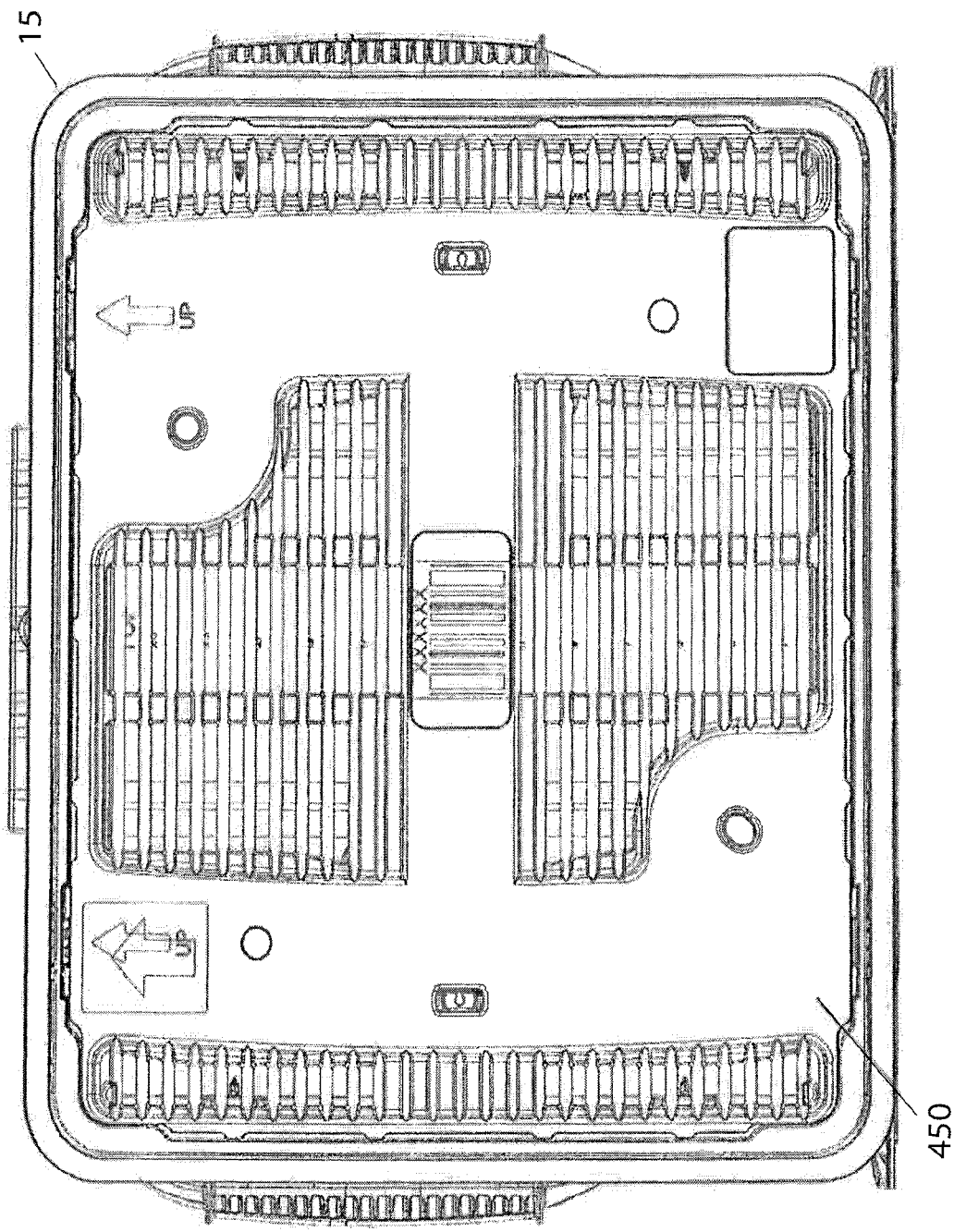
FIG. 20 is a front view of the FIG. 15 container assembly, according to an embodiment of the invention.
Figure 21:
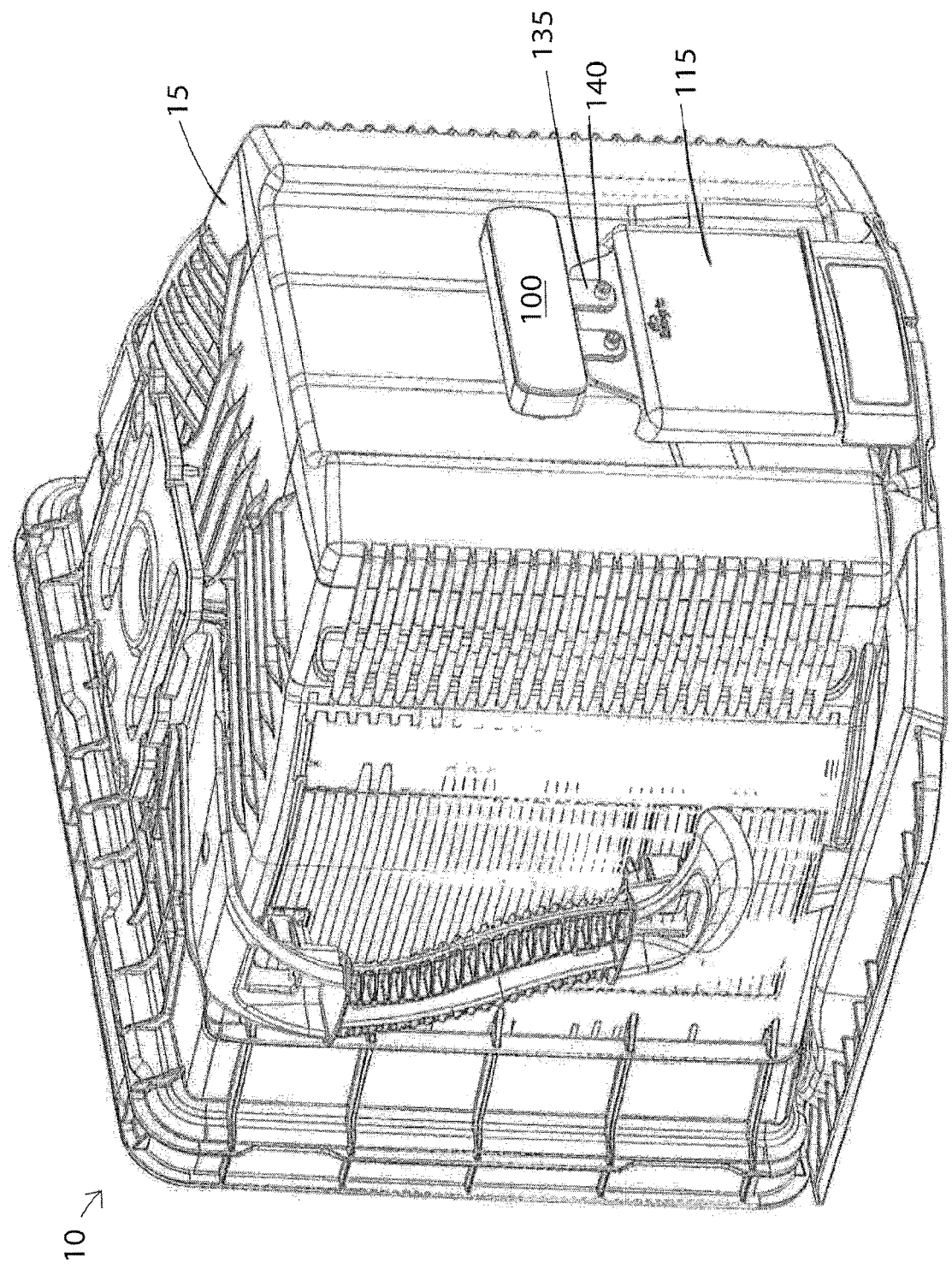
FIG. 21 is a rear perspective view of the FIG. 15 container assembly, according to an embodiment of the invention.

FIGS. 15-21 are detailed line drawings showing embodiments of the disclosure generally corresponding to those shown in FIGS. 2-7. Like reference numerals denote like elements within the figures. FIGS. 15 and 20 illustrate front door 450 of container 15, and the bottom view of FIG. 17 illustrates inlet purge ports 455 and outlet purge ports 460 for subjecting interior 75 to a purge flow stream, for example a nitrogen purge flow stream to interior 75 of container 15 to decrease concentrations of water, oxygen, and other contaminants. Module 100 and the other getter or desiccant modules described herein are outside the purge stream created via purge ports 455, 460, according to embodiments of the invention.

Various modifications and changes to the illustrated and described embodiments are within the scope of this application will be apparent to those skilled in the art. Changes may be made in form and substance without departing from the spirit and scope of the invention.

What is claimed is:

1. A substrate container assembly, comprising:
   a container, the container defining an exterior and defining an interior having a substrate storage area adapted to support one or more substrates, the container also defining an opening in the container between the exterior and the interior; the container having a door and a latching mechanism to sealingly secure the door closed, the door being openable for access to the substrate storage area, the door defining an interior side facing the interior of the container; and
   a getter module mounted to the container, the getter module comprising:
      a substantially rigid housing with an access opening;
      a getter material disposed within the substantially rigid housing, the getter material arranged to passively decrease concentration of contaminants within the substrate storage area of the container via the access opening and the opening in the container, free of any active purge flow through the getter module; and
      a filter positioned at the access opening, the filter including a filter housing containing a filter material, the housing defining windows therein.

2. The substrate container assembly of claim 1, further comprising a connection structure, the connection structure adapted to removably and sealingly secure the getter module with respect to the exterior of the container and to connect the access opening in the getter module housing to the opening in the container, whereby the getter material is positioned exterior the container and is communicable outside the module housing with the interior of the container.

3. The container assembly of claim 1, wherein the getter module comprises a base, getter material supported by the base, a cover to close the base, and a seal disposed between the cover and the base.

4. The container assembly of claim 1, wherein the getter material is disposed in or formed as a readily removable and replaceable getter cartridge.

5. The container assembly of claim 1, wherein the getter module comprises a slidable tray, the slidable tray being adapted to slide into and out of the housing for access to and replacement of the getter material.

6. The container assembly of claim 1, wherein the getter material comprises any one of a desiccant, a physiosoptive media, a chemisorptive media, a particulate filter media, and combinations thereof.

7. The container assembly of claim 2, wherein the container exterior is substantially curved and the getter module is substantially flat, the opening in the container being substantially tapered in cross section to sealingly accommodate the connection structure of the container.

8. A getter cartridge, comprising:
   a substantially rigid housing defining at least one access opening;
   a getter material supported within the housing;
   a filter disposed in the substantially rigid housing and positioned at the at least one passageway, the filter including a filter housing containing a filter material, the housing defining windows therein; and
   a connection structure adapted to secure the getter cartridge to the exterior surface of a back wall of a substrate container, such that getter material supported within the housing and the filter is exposed to an interior of the substrate container.

9. The getter cartridge of claim 8, wherein the connection structure defines the at least one passageway and is adapted for sealing to an opening in the substrate container to provide fluid communication between the interior of the substrate container and the getter material in the cartridge.

10. The getter cartridge of claim 8, wherein the connection structure further comprises a mounting tab adapted for securement to the structure on the exterior of the front opening wafer container.

\* \* \* \* \*